United States Patent
Krijn et al.

(10) Patent No.: US 11,549,651 B2
(45) Date of Patent: Jan. 10, 2023

(54) EYE-SAFE LASER-BASED LIGHTING

(71) Applicants: Marcellinus Petrus Carolus Michael Krijn, Eindhoven (NL); Martin Jacobus Johan Jak, Eindhoven (NL)

(72) Inventors: Marcellinus Petrus Carolus Michael Krijn, Eindhoven (NL); Martin Jacobus Johan Jak, Eindhoven (NL)

(73) Assignee: Signify Holding B.V., Eindhoven (NL)

( * ) Notice: Subject to any disclaimer, the term of this patent is extended or adjusted under 35 U.S.C. 154(b) by 182 days.

(21) Appl. No.: 14/848,306

(22) Filed: Sep. 8, 2015

(65) Prior Publication Data
US 2015/0380899 A1 Dec. 31, 2015

Related U.S. Application Data

(62) Division of application No. 13/001,858, filed as application No. PCT/IB2009/052837 on Jun. 30, 2009, now abandoned.

(30) Foreign Application Priority Data

Jul. 7, 2008 (EP) ..................................... 08104656

(51) Int. Cl.
F21K 9/64 (2016.01)
F21V 23/04 (2006.01)
(Continued)

(52) U.S. Cl.
CPC ................. *F21K 9/64* (2016.08); *F21S 41/16* (2018.01); *F21S 45/70* (2018.01);
(Continued)

(58) Field of Classification Search
CPC .. H01S 5/06825; H01S 5/0683; H01S 5/0078; H01S 5/005; H01S 5/06808;
(Continued)

(56) References Cited

U.S. PATENT DOCUMENTS 4,311,142 A 1/1982 Machida
4,680,810 A 7/1987 Swartz
(Continued)

FOREIGN PATENT DOCUMENTS

EP 0378061 A2 7/1990
EP 1063742 A1 12/2000
(Continued)

*Primary Examiner* — M. A. Golub-Miller

(57) ABSTRACT

A laser-based light source includes a laser device configured to generate laser light of a predetermined laser wavelength and emit this laser light as a laser beam. A light-conversion device is configured to convert at least part of the laser light into converted light and a laser-output sensor is configured to determine a laser-output signal proportional to the output of laser light emitted by the laser device. Further, a converted-light sensor is configured to determine a converted-light signal proportional to the output of converted light emitted by the light-conversion device. A controller is configured to receive the laser-output signal and the converted-light signal, to determine a safe-to-operate parameter, based on the laser-output signal and the converted-light signal, and to control the operation of the laser-based light source based on a comparison of the safe-to-operate parameter with a at least one predefined threshold.

11 Claims, 3 Drawing Sheets

(51) Int. Cl.
*F21S 45/70* (2018.01)
*F21S 41/16* (2018.01)
*H01S 5/0683* (2006.01)
*F21V 25/02* (2006.01)
*H01S 5/068* (2006.01)
*H01S 5/00* (2006.01)
*F21Y 115/30* (2016.01)
*F21V 25/00* (2006.01)

(52) U.S. Cl.
CPC ........ *F21V 23/0457* (2013.01); *H01S 5/0078* (2013.01); *H01S 5/0087* (2021.01); *H01S 5/0683* (2013.01); *H01S 5/06808* (2013.01); *H01S 5/06825* (2013.01); *F21V 25/00* (2013.01); *F21V 25/02* (2013.01); *F21Y 2115/30* (2016.08)

(58) Field of Classification Search
CPC .. F21S 45/70; F21S 41/16; F21K 9/64; F21V 23/0457; F21V 25/02; F21V 25/00
See application file for complete search history.

(56) References Cited

U.S. PATENT DOCUMENTS

| | | | |
|---|---|---|---|
| 4,994,059 A | 2/1991 | Kosa et al. | |
| 5,552,926 A | 9/1996 | Owa et al. | |
| 6,535,327 B1 | 3/2003 | Vodopyanov | |
| 6,590,915 B1 | 7/2003 | Kitaoka et al. | |
| 6,693,268 B2 | 2/2004 | Wang | |
| 6,867,929 B2 | 3/2005 | Lopez-Hernandez et al. | |
| 6,890,234 B2 | 5/2005 | Bortscheller | |
| 6,984,039 B2 | 1/2006 | Agostinelli | |
| 7,184,614 B2 | 2/2007 | Slatkine | |
| 7,346,087 B2 | 3/2008 | Guenter et al. | |
| 8,400,011 B2 * | 3/2013 | Kawaguchi | F21S 41/16 307/9.1 |
| 2002/0016620 A1 | 2/2002 | Tsujita | |
| 2002/0061033 A1 | 5/2002 | Kitaoka et al. | |
| 2002/0079506 A1 | 6/2002 | Komoto et al. | |
| 2003/0002109 A1 | 1/2003 | Hochberg et al. | |
| 2004/0066807 A1 | 4/2004 | Kasazumi et al. | |
| 2005/0213958 A1 | 9/2005 | Uemura | |
| 2007/0013910 A1 | 1/2007 | Jiang et al. | |
| 2007/0073845 A1 | 3/2007 | Reisman | |
| 2007/0149858 A1 | 6/2007 | Ogawa | |
| 2007/0274068 A1 | 11/2007 | Berben et al. | |
| 2008/0019147 A1 | 1/2008 | Erchak et al. | |
| 2008/0142816 A1 | 6/2008 | Bierhuizen et al. | |
| 2016/0010812 A1 * | 1/2016 | Kroell | F21K 9/64 353/84 |
| 2016/0033112 A1 * | 2/2016 | Weissenberger | F21S 41/16 362/510 |
| 2017/0104972 A1 * | 4/2017 | Novotny | H04N 9/3144 |
| 2017/0122516 A1 * | 5/2017 | Hager | F21S 41/125 |
| 2017/0240094 A1 * | 8/2017 | Künecke | F21S 45/70 |
| 2017/0322154 A1 * | 11/2017 | Hoehmann | G02B 27/28 |
| 2017/0322155 A1 * | 11/2017 | Drumm | F21V 13/08 |
| 2018/0209602 A1 * | 7/2018 | Kerscher | F21V 9/30 |
| 2019/0024863 A1 * | 1/2019 | Gammer | F21S 41/321 |
| 2019/0178460 A1 * | 6/2019 | Hadrath | F21S 41/285 |
| 2019/0237645 A1 * | 8/2019 | Forster | F21V 9/30 |
| 2020/0284883 A1 * | 9/2020 | Ferreira | G01S 7/4817 |

FOREIGN PATENT DOCUMENTS

| | | |
|---|---|---|
| EP | 1403936 A2 | 3/2004 |
| EP | 1933197 A1 | 6/2008 |
| JP | 9064445 A | 3/1997 |
| JP | 2002329924 A | 11/2002 |
| JP | 2003072141 A | 3/2003 |
| JP | 2003279444 A | 10/2003 |
| JP | 2004281588 A | 10/2004 |
| JP | 2008122838 A | 5/2008 |
| WO | 2007091687 A1 | 8/2007 |
| WO | 2008008678 A2 | 1/2008 |
| WO | 2008044673 A1 | 4/2008 |
| WO | 2008052318 A1 | 5/2008 |

* cited by examiner

EYE-SAFE LASER-BASED LIGHTING

CROSS-REFERENCE TO RELATED APPLICATIONS

This application is a divisional of prior U.S. patent application Ser. No. 13/001,858, filed Dec. 29, 2010, which is a national application of PCT Application No. PCT/IB2009/052837, filed Jun. 30, 2009 and claims the benefit of European Patent Application No. 08104656.7, filed Jul. 7, 2008, the entire contents of each of which are incorporated herein by reference thereto.

FIELD OF THE INVENTION

The invention relates to the field of a laser-based light source and a method of operating the same, and especially to eye-safe laser-based lighting.

BACKGROUND OF THE INVENTION

During the last decades, thanks to the advances of semiconductor technology, LEDs (Light Emitting Diodes) have become more and more important in lighting applications. Technological breakthroughs in high-power LEDs have opened the door to new lighting concepts driven by miniaturization, lifetime, efficiency and sustainability.

Compared to LEDs, the advantage of lasers is their much higher brightness. Semiconductor lasers have started to become available in output powers of several Watts, thus enabling a high lumen output. Laser light by itself will not be of much use for illumination since the laser beam is too bright to be eye-safe, too monochromatic for faithful colour reproduction and will result in annoying speckle due to its coherence. A convenient way to resolve these issues is to produce a light source by converting part of the laser light into broadband light via phosphor conversion.

In nearly all white-light emitting LEDs, a blue emitter is combined with a yellow-light emitting phosphor. By pumping the yellow phosphor with blue light, part of the blue light is converted into broadband yellow light. This yellow light in combination with the remaining blue light renders white light. The colour temperature can be tuned by tuning the phosphor composition and by tuning the ratio of phosphor converted light and remaining blue pump light.

In the same manner, a blue light emitting laser diode can be used to pump a yellow phosphor to generate white light. Alternatively, a near-UV diode laser can be used to pump a phosphor that emits white light or light of a specific colour. Yet another alternative is to use a red or near-IR laser diode in combination with an upconversion phosphor to generate white light or light of a specific colour.

Such laser-based light sources relying on phosphor conversion have the advantage that they can be much brighter than the brightness achievable with LEDs: with a laser one can achieve a much higher optical power density at the phosphor than with LEDs. Such light sources are ideal for automotive headlamps and spot-lights. However, one critical issue with laser-based lighting is the fact that the light source should adhere to strict legislation and be eye-safe under all circumstances, even when tampered with.

SUMMARY OF THE INVENTION

It is an object of the invention to provide a laser-based light source and a method of operating the same, which enable reliable eye-safety to be achieved in an easy way.

This object is achieved by a laser-based light source, comprising
a laser device adapted for generating laser light of a predetermined laser wavelength and emitting this laser light as a laser beam;
a light-conversion device for converting at least part of the laser light into converted light;
a laser-output sensor for determining a laser-output signal being correlated with the output of laser light emitted by the laser device;
a converted-light sensor for determining a converted-light signal being correlated with the output of converted light emitted by the light-conversion device; and
a controller which is adapted for receiving the laser-output signal and the converted-light signal, for determining a safe-to-operate parameter based on the laser-output signal and the converted-light signal, and for controlling the operation of the laser-based light source based on a comparison between the safe-to-operate parameter and at least one predefined threshold.

The invention is applicable for different types of light-conversion devices. Especially, as light-conversion devices, phosphors as described above, but also up-conversion materials, are preferred, i.e. devices which convert the light to light of another wavelength. But also materials that do not alter the wavelength but the beam properties, e.g. scattering devices, are preferred. Especially the use of a scattering device is advantageous, since this allows reducing the coherence of the beam and, thus, reduces speckle.

Accordingly, the invention is based on monitoring a signal being correlated with the laser output and a signal being correlated with the amount of converted light. The correlation between the signals and the laser output and/or the amount of converted light may be linear, exponential, logarithmic or the like. In case it is detected on the basis of these signals that a predefined safe-to-operate parameter falls below or exceeds a predefined threshold, the operation of the laser-based light source is automatically adapted accordingly. Situations in which the laser-based light source would be unsafe to operate are when the package of the light source is opened, when an optical component of the light source is removed, when phosphor degradation or phosphor removal occurs, when the position of any component or light-conversion device has moved beyond a predefined tolerance value, or when a light-guiding part, e.g. an optical fiber, is cut or damaged etc.

In general, different types of sensors can be used as laser-output sensor or converted-light sensor. However, according to a preferred embodiment of the invention, the laser-output sensor is formed by a laser-light photodiode adapted for receiving at least a part of the laser light. With respect to this, it is preferred to use a beam splitter in order to direct a part of the laser light emitted by the laser device to the laser-light photodiode. In this way, a direct measurement of the laser output can be achieved. Additionally or alternatively, the laser-output sensor is preferably formed by a laser driving current monitor adapted for monitoring the laser driving current. With respect to this, it is especially preferred to monitor the laser driving current, which is typically proportional to a laser output, apart from a threshold current.

Further, it is preferred that the converted-light sensor is adapted to receive at least a part of the converted light. The converted light sensor may be a photodiode or the like. For that reason, preferably light emitted by the light-conversion device in a direction back to the laser is used. Further, it is preferred to use a beam splitter, preferably the same beam splitter as used for the laser light, in order to direct part of the light emitted by the light-conversion device to the converted-light sensor.

Generally, the laser light can be directly coupled into the light-conversion device. However, according to a preferred embodiment of the invention, at least one optical fiber is provided which is adapted for guiding the laser light to the light-conversion device. This makes it possible to place the light-conversion device at a greater distance from the laser device. Further, it is preferred that an optical fiber is provided which is adapted for guiding at least part of the converted light in a direction back from the light-conversion device to the converted-light sensor. Especially, the same optical fiber can be used for guiding the light to the light-conversion device and back, or a separate return fiber can be used for the way back. Furthermore, a single fiber or a plurality of fibers can be used to form a fiber.

The converted-light sensor can be arranged at different positions. According to a preferred embodiment of the invention, the converted-light sensor is arranged at the end of the fiber which is remote from the light-conversion device. Alternatively, according to a preferred embodiment of the invention, the converted-light sensor is arranged at a position along the fiber, and an outcoupling device is provided for coupling the converted light out of the fiber and into the converted-light sensor. Furthermore, it is preferred to tap laser light at at least one point along the fiber and guide this light to a remote light-conversion device.

Moreover, when an optical fiber is used, according to a preferred embodiment of the invention, the optical fiber is provided with electrical wiring for detecting damage of the optical fiber. With respect to this, it is especially preferred that conducting wires are wound around the optical fiber, and when a wire is cut or when the capacity changes, it is detected that the fiber might be broken. In this case, a warning can be given and/or the laser device and, thus, the complete light source are preferably shut down.

Finally, it should be emphasized that according to a preferred embodiment of the invention, the light source is enclosed to prevent tampering and to preclude as much as possible that external stray light, e.g. daylight or artificial light, enters and influences the output signals of the laser-output sensor and the converted-light sensor.

The above-mentioned object is further addressed by a method of operating a laser-based light source, comprising the following steps:
generating laser light of a predetermined laser wavelength and emitting this laser light as a laser beam;
converting at least part of the laser light into converted light;
determining a laser-output signal being correlated with the output of emitted laser light;
determining a converted-light signal being correlated with the output of converted light; and
determining a safe-to-operate parameter based on the laser output signal and the converted light signal;
comparing the safe-to-operate parameter with at least one predefined threshold; and
controlling the operation of the laser-based light source, based on the comparison of the safe-to-operate parameter with the predefined threshold.

According to a preferred embodiment of the invention, the converted light is light of another wavelength or/and light with other beam characteristics.

According to a preferred embodiment of the invention, this method further comprises the step of comparing the safe-to-operate parameter with a second predefined threshold. In other words, according to this preferred embodiment of the invention, it is checked whether the safe-to-operate parameter lies within or outside a predefined range.

Further, it is preferred that the method comprises the step of determining the safe-to-operate parameter, based on a ratio between the laser-output signal and the converted-light signal. Furthermore, it is preferred that the step of determining the safe-to-operate parameter is based on the derivative with respect to time of the ratio between the laser-output signal and the converted-light signal. With these ratios it can be ascertained in an easy and reliable way whether the light source is safe to operate.

In general, the laser light can be emitted in a constant and continuous way. However, according to a preferred embodiment of the invention, the method comprises the steps of modulating the emitted laser light in time, and determining the safe-to-operate parameter based on a ratio of the laser-output signal and the converted-light signal at different points in time.

According to another preferred embodiment of the invention, the step of controlling the operation of the laser-based light source, based on the comparison of the safe-to-operate parameter with the predefined threshold, comprises shutting down laser emission or/and generating a warning. In this way, a user of the light source is at least warned that handling the damaged light source might be dangerous, and if laser emission is shut down, there is no longer a risk of eye-injury due to the laser beam.

Since, according to the invention, the laser-output signal and the converted-light signal are determined, it is especially preferred that the light output of the laser-based light source is stabilized on the basis of the determined laser-output signal or/and the determined converted-light signal. This can especially be done using a closed control loop for controlling the laser-output in dependence on the determined laser-output signal or/and the determined converted-light signal, i.e. the conversion rate.

Finally, it should be mentioned that it is especially preferred that the laser device is a diode laser. Furthermore, since many diode lasers have a built-in photodiode to monitor the laser output, this built-in photodiode is preferably used as the laser-output sensor, which means that no additional sensor is necessary for this purpose.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
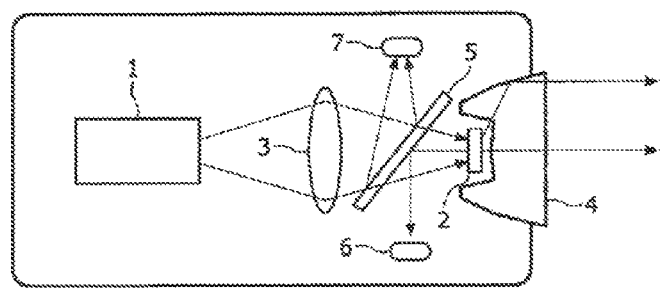
FIG. 1 schematically depicts an embodiment according to the invention.

A first embodiment according to the invention is schematically depicted in FIG. 1. Laser light is generated by a laser device 1, i.e. a diode laser, e.g. in an edge-emitting geometry or a vertical-cavity surface-emitting geometry (VCSEL). This laser light is directed via optics 3 to a volume of phosphorous material of a light-conversion device 2 which is in a powderous or crystalline, preferably polycrystalline, state. The laser device 1 emits blue light, preferably around 445 nm. The light-conversion device 2 converts the blue laser light into broadband yellow light. The combination of this yellow light and the remainder of the blue light results in white light. The white light generated in this way is shaped into a beam by means of collimating optics 4.

Some of the light generated by the light-conversion device 2 as well as some of the laser light is redirected towards the laser device 1. A beam splitter 5 at an angle of 45° is used to direct a fraction of this light towards a converted-light sensor 6 which is formed by a photodiode. A small fraction of the blue laser light is directed towards a laser-output sensor 7 which is formed by another photodiode. The beam splitter 5 may be a simple thin piece of glass or a dichroic filter reflecting the yellow light generated by the light-conversion device 2 and transmitting the blue light of the laser device 1. Also the photodiodes may be equipped with colour filters in order to enhance the selectivity for either the laser-converted light or the phosphor-converted light.

By monitoring the signal generated by converted-light sensor 6 and laser-output sensor 7, preferably after further filtering and amplifying, it is determined whether the light-source is safe to operate or not. For example, as long as the ratio of the phosphor output and the laser output lies within a lower and an upper predefined threshold, respectively, the laser device 1 can be considered to be safe to operate. Similarly, when the modulus of the derivative in time of the ratio of the phosphor output and the laser output exceeds a predefined threshold, the laser device 1 might be considered to be unsafe to operate and is switched off.

Figure 2:
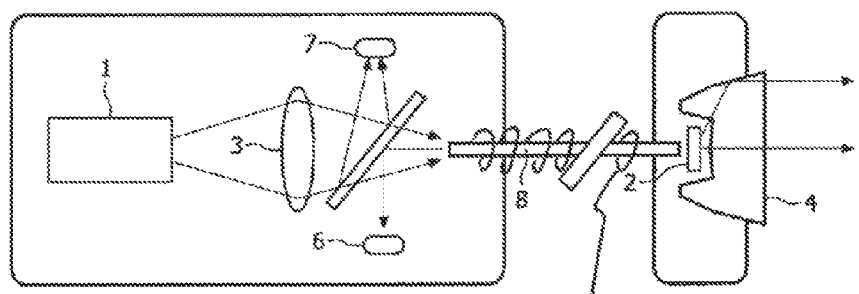
FIG. 2 schematically depicts another embodiment of the invention.

Another embodiment according to the invention is schematically depicted in FIG. 2. In this case, the location of laser light generation is decoupled from the location of light conversion. An optical fiber 8 is used to transport the laser light towards the remote light-conversion device 2. Part of the light generated by the remote light-conversion device 2 is sent back through the fiber towards converted-light sensor 6. Alternatively, a separate return fiber (not shown) can be used. As shown in FIG. 2, the optical fiber is provided with electrical wiring 12 for detecting damage of the optical fiber. With respect to this, it is especially preferred that conducting wires 12 are wound around the optical fiber, and when a wire is cut or when the capacity changes, it is detected that the fiber might be broken. In this case, a warning can be given and/or the laser device and, thus, the complete light source are preferably shut down.

Figure 3:
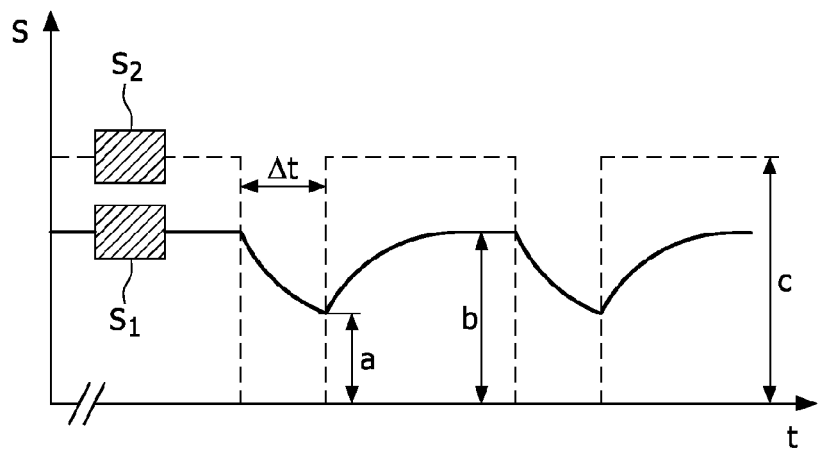
FIG. 3 depicts modulation of the laser output and the corresponding converted light according to another embodiment of the invention.

The principle of operation of a still other embodiment is explained in the following with reference to FIG. 3. The light output from the laser device 1 as measured by laser-output sensor 7 is modulated in time, which is shown by the dotted line (signal $S_2$ in FIG. 3). The signal measured by the phosphor-output detector looks like the solid line (signal $S_1$) in FIG. 3 since a phosphor has a finite response time, given by a decay time. The detected phosphor output is proportional to the phosphor-converted yellow light generated and might contain a fraction of the blue laser light. By monitoring for example the signal strengths a and b of the detected phosphor output at different points in time, relative to the strength c of the laser output, as depicted in FIG. 3, it can be ascertained whether the light source is safe to operate.

Alternatively, the laser output can be modulated in a periodic fashion. Due to the finite response time of the phosphor, the signal measured by the converted-light sensor 6 is delayed in phase relative to the signal measured by the laser-output sensor 7. Monitoring the modulation depth of the detected signals as well as the phase delay between them provides sufficient information to ascertain whether the light source is safe to operate.

Figure 4:
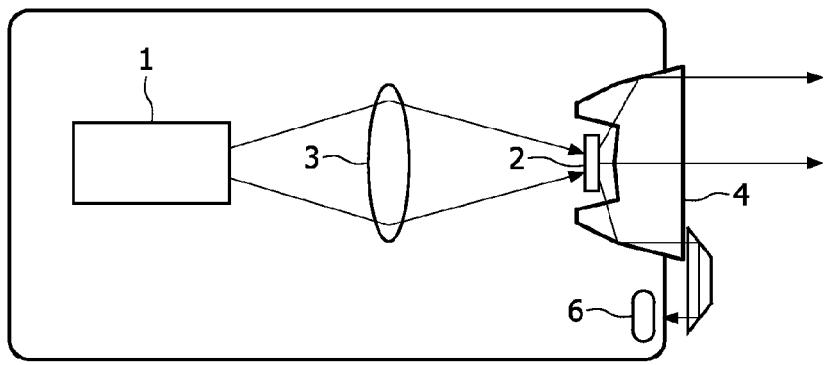
FIG. 4 schematically depicts another embodiment of the invention.

Still another embodiment according to the invention is shown in FIG. 4. In this embodiment, only one photodiode is provided which forms the converted-light sensor 6. The role of the other photodiode in the embodiments described above is taken over by monitoring the driving current of the laser device 1. This current is proportional to the laser output, apart from a threshold current.

Figure 5:
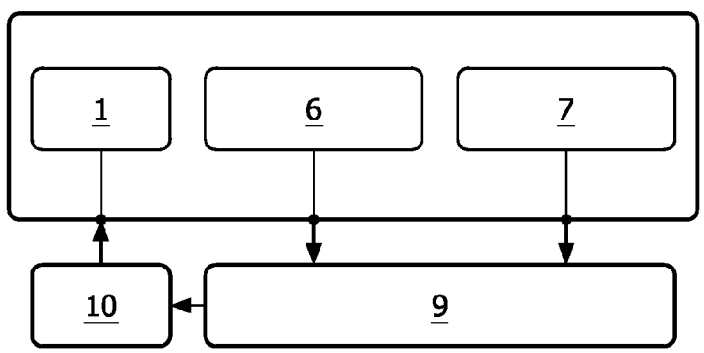
FIG. 5 schematically depicts a block diagram according to another embodiment of the invention.

Finally, a general schematic block diagram of the laser-based light source according to an embodiment of the invention is shown in FIG. 5. Part of the light emitted by the laser device 1 and part of the light converted by the light-conversion device 2 is detected by a laser-output sensor 7 and a converted-light sensor 6, respectively, as has been described above. These signals are read by a controller 9, which controls a laser driver 10. The laser driver 10 sets the laser power and can switch the beam on and off, or can switch it to an eye-safe intermediate state. As shown in FIG. 5, the controller is directly connected to the converted-light sensor 6 and the laser-output sensor 7.

Figure 6:
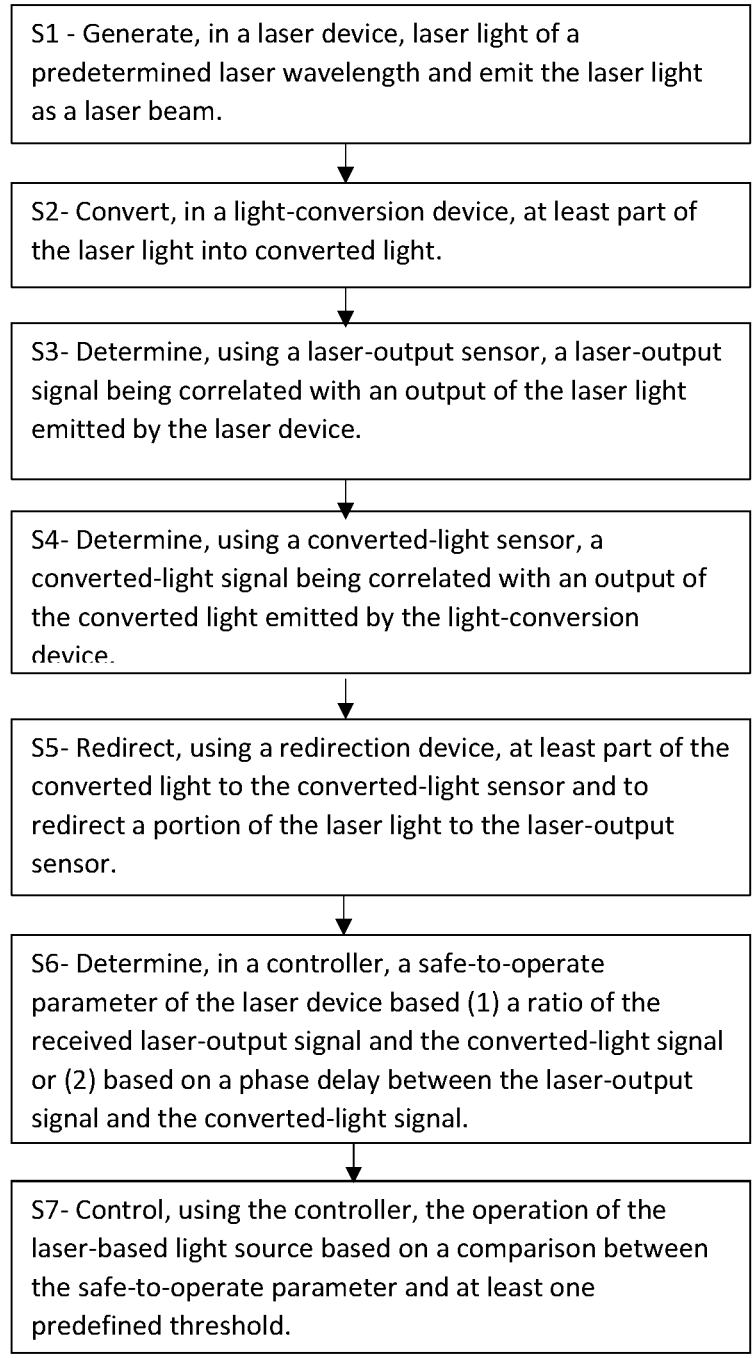
FIG. 6 shows a flow chart of a laser-based light source safe-to-operate process according to an aspect of the invention.

FIG. 6 shows a flow chart of a laser-based light source safe-to-operate process according to an aspect of the invention. In step S1, generate, in a laser device 1, laser light of a predetermined laser wavelength and emit the laser light as a laser beam. In step S2, convert, in a light-conversion device 2, at least part of the laser light into converted light. In step S3, determine, using a laser-output sensor 7, a laser-output signal being correlated with an output of the laser light emitted by the laser device. In step S4, determine, using a converted-light sensor 6, a converted-light signal being correlated with an output of the converted light emitted by the light-conversion device. In step S5, redirect, using a redirection device 5, at least part of the converted light to the converted-light sensor 6 and to redirect a portion of the laser light to the laser-output sensor 7. In step S6, determine, in a controller 9, a safe-to-operate parameter of the laser device based (1) a ratio of the received laser-output signal and the converted-light signal or (2) based on a phase delay between the laser-output signal and the converted-light signal. In step S7, Control, using the controller 9, the operation of the laser-based light source based on a comparison between the safe-to-operate parameter and at least one predefined threshold.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A laser-based light source, comprising:
   a laser device configured to generate laser light of a predetermined laser wavelength, modulate the laser light, and emit the laser light as a laser beam that is modulated in time;
   a phosphor light-conversion device configured to convert at least part of the laser light into phosphor converted light;
   a laser-output sensor configured to receive a portion of an output of the laser light emitted by the laser device and determine laser-output signal being correlated with the output of the laser light;
   a phosphor converted-light sensor configured to receive a portion of an output of the phosphor converted light emitted by the phosphor light-conversion device and determine converted-light signal being correlated with the output of the phosphor converted light; and
   a controller configured to receive the laser-output signal and the phosphor converted-light signal, monitor the modulation depths of the received signals, determine a safe-to-operate parameter of the laser device based on the modulation depths and a phase delay between the laser-output signal and the phosphor converted-light signal, and provide a warning indicator to a user and/or control operation of the laser-based light source based on a comparison between the safe-to-operate parameter and at least one predefined threshold.

2. The laser-based light source of claim 1, wherein the laser-output sensor is formed by a laser-light photo diode configured to receive the portion of the laser light.

3. The laser-based light source of claim 1, further comprising at least one optical fiber configured to guide the laser light to the light-conversion device.

4. The laser-based light source of claim 3, wherein the phosphor converted-light sensor is arranged at an end of the optical fiber which is remote from the phosphor light-conversion device.

5. The laser-based light source of claim 3, wherein the phosphor converted-light sensor is arranged at a position along the optical fiber, and further comprising a decoupling device configured to couple the phosphor converted light out of the optical fiber and into the phosphor converted-light sensor.

6. The laser-based light source of claim 3, wherein the optical fiber is provided with an electrical wiring for detecting damage to the optical fiber.

7. The laser-based light source of claim 1, wherein the controller is configured to compare the safe-to-operate parameter with two predefined thresholds.

8. The laser-based light source of claim 1, wherein the controller is configured to at least one of shut down laser emission, switch the laser emission to a safe intermediate level based on the comparison between the safe-to-operate parameter and at least one predefined threshold.

9. The laser-based light source of claim 1, further including a redirection device having a beam splitter configured to reflect the at least part of the converted light to the phosphor converted-light sensor and to reflect the portion of the laser light to the laser-output sensor.

10. A laser-based light source, comprising:
    a laser device configured to generate laser light of a first wavelength, modulate the laser light, and emit the light as a laser beam that is modulated in time;
    a phosphor light-conversion device configured to convert at least part of the laser light into phosphor converted light of a second wavelength different from the first wavelength;
    wherein at least portions of the laser light of the first wavelength and the phosphor converted light of the second wavelength are combined in the laser-based light source to form white light;
    a laser-output sensor configured to receive part of an output of the laser light emitted by the laser device and determine a laser-output signal being correlated with the output of the laser light emitted by the laser device;
    a phosphor converted-light sensor configured to receive a portion of an output of the phosphor converted light emitted by the phosphor light-conversion device and determine if a converted-light signal being correlated with the output of the phosphor converted light emitted by the phosphor light-conversion device; and
    a controller configured to receive the laser-output signal and the phosphor converted-light signal, monitor the modulation depths of the received signals, determine a safe-to-operate parameter of the laser device based on the modulation depths and a phase delay between the laser-output signal and the phosphor converted-light signal, and control operation of the laser-based light source based on a comparison between the safe-to-operate parameter and at least one predefined threshold.

11. The laser-based light source of claim 1, wherein the safe-to-operate parameter relates to the laser-based light source being in an unsafe to operate condition, and wherein the unsafe to operate condition includes at least one of: when a package containing the light source is opened, when a removable optical component of the light source is removed, when phosphor degradation or a removable phosphor removal occurs, when the position of any component or light-conversion device is beyond a predefined tolerance value, or when a light-guiding part in the laser-based light source, including an optical fiber, is cut or damaged.

* * * * *